(12) United States Patent
Nakagawa

(10) Patent No.: US 7,786,569 B2
(45) Date of Patent: Aug. 31, 2010

(54) SEMICONDUCTOR DEVICE USING WIRING SUBSTRATE HAVING A WIRING STRUCTURE REDUCING WIRING DISCONNECTION

(75) Inventor: Kazuyuki Nakagawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 316 days.

(21) Appl. No.: 12/013,422

(22) Filed: Jan. 12, 2008

(65) Prior Publication Data

US 2008/0174004 A1    Jul. 24, 2008

(30) Foreign Application Priority Data

Jan. 19, 2007    (JP) .............................. 2007-010262

(51) Int. Cl.
*H01L 23/053* (2006.01)
*H01L 23/12* (2006.01)
(52) U.S. Cl. .............................. 257/700; 257/E23.016; 257/690; 257/698; 361/761; 361/765; 174/262
(58) Field of Classification Search .......... 257/E21.499, 257/E23.08, E23.036, 690, 668, 698, 778, 257/700, 738, 748, 773, 774, 781, 786, 790; 438/122; 361/761, 306.3, 765, 794, 795; 174/262, 255, 264
See application file for complete search history.

(56) References Cited

U.S. PATENT DOCUMENTS

| | | | |
|---|---|---|---|
| 6,265,244 B1 | 7/2001 | Hayashi et al. | |
| 6,350,365 B1 * | 2/2002 | Koyama et al. | ............. 205/125 |
| 6,941,537 B2 * | 9/2005 | Jessep et al. | .................. 716/15 |
| 6,967,403 B2 * | 11/2005 | Chuang et al. | .............. 257/717 |
| 6,995,322 B2 * | 2/2006 | Chan et al. | ................... 174/262 |
| 7,002,075 B2 * | 2/2006 | Kambe et al. | ............... 174/565 |
| 7,035,081 B2 * | 4/2006 | Nagata et al. | ............ 361/306.3 |
| 7,164,592 B2 * | 1/2007 | Yoshikawa et al. | ............ 365/51 |
| 7,279,771 B2 * | 10/2007 | Sunohara et al. | ............ 257/516 |
| 7,321,166 B2 * | 1/2008 | Sakai et al. | ................ 257/700 |
| 7,342,317 B2 * | 3/2008 | Ho et al. | ..................... 257/774 |
| 7,352,060 B2 * | 4/2008 | Shimizu et al. | ............. 257/700 |
| 7,378,602 B2 * | 5/2008 | Ikeda | ......................... 174/262 |
| 7,378,745 B2 * | 5/2008 | Hayashi et al. | ............. 257/778 |
| 7,415,762 B2 * | 8/2008 | Fukase et al. | ................. 29/852 |

(Continued)

FOREIGN PATENT DOCUMENTS

JP    7-307363 A    11/1995

(Continued)

*Primary Examiner*—Chris C Chu
(74) *Attorney, Agent, or Firm*—Miles & Stockbridge P.C.

(57) ABSTRACT

The semiconductor device concerning the present invention has a wiring substrate, a semiconductor chip, under-filling resin, a reinforcement ring, a heat spreader, a power supply pattern and a wiring layer under surface via land which are formed on the wiring substrate and spaced out by a clearance region, an insulating film, a wiring layer via land, a via, and a wiring which is formed on the insulating film, passes over the clearance region, and connects the wiring layer via land to the semiconductor chip. The wiring layer via land is formed between the semiconductor chip and the reinforcement ring, and within a region of a 1 mm width from the extension line of the diagonal line of the semiconductor chip. The angle of the lead-out direction of the wiring from a wiring layer via land to the extension line of the diagonal line of the semiconductor chip is 20° or more.

7 Claims, 15 Drawing Sheets

U.S. PATENT DOCUMENTS

| | | | |
|---|---|---|---|
| 7,473,988 B2 * | 1/2009 | Urashima et al. | 257/668 |
| 7,507,913 B2 * | 3/2009 | Inagaki et al. | 174/260 |
| 7,525,814 B2 * | 4/2009 | Yuri et al. | 361/761 |
| 7,605,460 B1 * | 10/2009 | Wu et al. | 257/691 |
| 7,605,480 B2 * | 10/2009 | Pendse | 257/778 |
| 7,613,007 B2 * | 11/2009 | Amey et al. | 361/763 |
| RE41,051 E * | 12/2009 | Asai et al. | 361/794 |
| 7,696,442 B2 * | 4/2010 | Muramatsu et al. | 174/260 |

FOREIGN PATENT DOCUMENTS

| | | |
|---|---|---|
| JP | 11-163201 A | 6/1999 |
| JP | 2000-183469 A | 6/2000 |
| JP | 2000-349123 A | 12/2000 |
| JP | 2001-60600 A | 3/2001 |
| JP | 2006-128712 A | 5/2006 |

* cited by examiner

SEMICONDUCTOR DEVICE USING WIRING SUBSTRATE HAVING A WIRING STRUCTURE REDUCING WIRING DISCONNECTION

CROSS-REFERENCE TO RELATED APPLICATION

The present application claims priority from Japanese patent application No. 2007-10262 filed on Jan. 19, 2007, the content of which is hereby incorporated by reference into this application.

1. Field of the Invention

The present invention relates to a semiconductor device which makes flip chip connection of a semiconductor chip to a wiring substrate, and its manufacturing method.

2. Description of the Background Art

The semiconductor device which makes flip chip connection of a semiconductor chip to a wiring substrate is proposed (for example, refer to Patent Reference 1). In case of such a flip chip connection, the technique of fluxless flip chip junction by applying a scrub to a semiconductor chip is proposed (for example, refer to Patent Reference 2).

A wiring is formed on a wiring substrate and an upper part of wiring is covered by solder resist (for example, refer to Patent Reference 3). However, since the semiconductor chip and the wiring substrate have a difference in the coefficient of linear expansion, there is a problem that disconnection of the wiring on a wiring substrate occurs with internal stress. Various methods are proposed in order to solve this (for example, refer to Patent References 4-6).

FIG. 23 is a plan view showing a conventional semiconductor device. Flip chip connection of semiconductor chip 12 is made to wiring substrate 11. The gap between wiring substrate 11 and semiconductor chip 12 is filled up with underfilling resin 13. On wiring substrate 11 and around semiconductor chip 12, reinforcement ring 14 is formed, spaced out from semiconductor chip 12. The heat spreader (not illustrated) for diffusing the heat generated in semiconductor chip 12 outside is adhered to this semiconductor chip 12 and reinforcement ring 14.

FIG. 24 is a plan view which expands portion D enclosed with the dotted line of FIG. 23. Wiring 31 and wiring layer via land 32 are formed on wiring substrate 11. Wiring 31 connects wiring layer via land 32 to semiconductor chip 12. Wiring layer via land 32 is located between semiconductor chip 12 and reinforcement ring 14, and is formed within regions of 1 mm width from the extension line of the diagonal line of semiconductor chip 12.

FIG. 25 is a cross-sectional view showing a conventional wiring layer via land and a conventional wiring. Power supply pattern 33 and wiring layer under surface via land 34 are formed on wiring substrate 11, and both are spaced out each other by clearance region 35. Power supply pattern 33 and wiring layer under surface via land 34 are covered with insulating film 36. Wiring layer via land 32 is formed on insulating film 36. Wiring layer under surface via land 34 and wiring layer via land 32 are connected by via 37 which penetrates insulating film 36. Wiring 31 pulled out from wiring layer via land 32 is passing over the upper part of clearance region 35. In the conventional semiconductor device, wiring 31 is led out from wiring layer via land 32 in much the same direction as that of an extension line of the diagonal line of semiconductor chip 12.

FIG. 26 is a cross-sectional view showing the manner where flip chip connection of the semiconductor chip is made to the wiring substrate by the conventional method. Wiring 31 is formed on wiring substrate 11, upper part of wiring substrate 11 is covered by solder resist 41, and opening 42 is formed in solder resist 41 so that wiring 31 may be exposed. Wiring 31 of wiring substrate 11 and electrode 43 of semiconductor chip 12 are being connected by solder bump 24.

[Patent Reference 1] Japanese laid-open patent No. 2006-128712

[Patent Reference 2] Japanese laid-open patent No. 2000-349123

[Patent Reference 3] Japanese laid-open patent No. Hei 7 (1995)-307363

[Patent Reference 4] Japanese laid-open patent No. Hei 11 (1999)-163201

[Patent Reference 5] Japanese laid-open patent No. 2000-183469

[Patent Reference 6] Japanese laid-open patent No. 2001-60600

SUMMARY OF THE INVENTION

In a conventional semiconductor device, there is a problem that wiring 31 led out from wiring layer via land 32 is disconnected over clearance region 35. The following can be considered as a factor of this problem.

1. The internal stress by a difference of a coefficient of linear expansion of semiconductor chip 12 and wiring substrate 11 etc. concentrates within a region of 1 mm width from the extension line of the diagonal line of semiconductor chip 12.

2. Between semiconductor chip 12 and reinforcement ring 14, since there are no reinforcement on wiring substrate 11, deformation of wiring substrate 11 by the internal stress concerned becomes large.

3. The internal stress concerned becomes the strongest in the direction of the extension line of the diagonal line of semiconductor chip 12.

4. Near the boundary of wiring 31 and wiring layer via land 32, since the size of a wiring changes abruptly, the internal stress concerned concentrates.

5. The internal stress concerned concentrates over clearance region 35 which spaces out power supply pattern 33 and wiring layer under surface via land 34.

In the semiconductor device which makes flip chip connection by the conventional method, there is a problem that an open failure of solder bump 24 occurs as shown in the right-hand side of FIG. 26. This is considered to be because solder bump 24 having a tendency to become spherical with surface tension receives stress from the corner of opening 42 of solder resist 41. Especially when applying a scrub to a semiconductor chip in the step of making flip chip connection, an open failure of solder bump is likely to occur.

The present invention was made in order to solve the above problems. The first purpose of the present invention is to obtain the semiconductor device which can prevent disconnection of the wiring led out from the wiring layer via land.

The second purpose of the present invention is to obtain a manufacturing method of a semiconductor device which can prevent a solder bump's open failure.

The semiconductor device concerning one example of the present invention has a wiring substrate, a semiconductor chip, under-filling resin, a reinforcement ring, a heat spreader, a power supply pattern and a wiring layer under surface via land formed on the wiring substrate and spaced out by a clearance region, an insulating film, a wiring layer via land, a via, and a wiring which is formed on the insulating film, passes over the clearance region, and connects the wiring layer via land to the semiconductor chip. The wiring layer via land is formed between the semiconductor chip and the reinforcement ring, and within a region of 1 mm width from an extension line of a diagonal line of the semiconductor chip. An angle of an lead-out direction of the wiring from the wiring layer via land to the extension line of the diagonal line of the semiconductor chip is 20° or more.

According to this example, disconnection of the wiring led out from the wiring layer via land can be prevented.

DETAILED DESCRIPTION OF THE PREFERRED EMBODIMENTS

Embodiment 1

Figure 1:
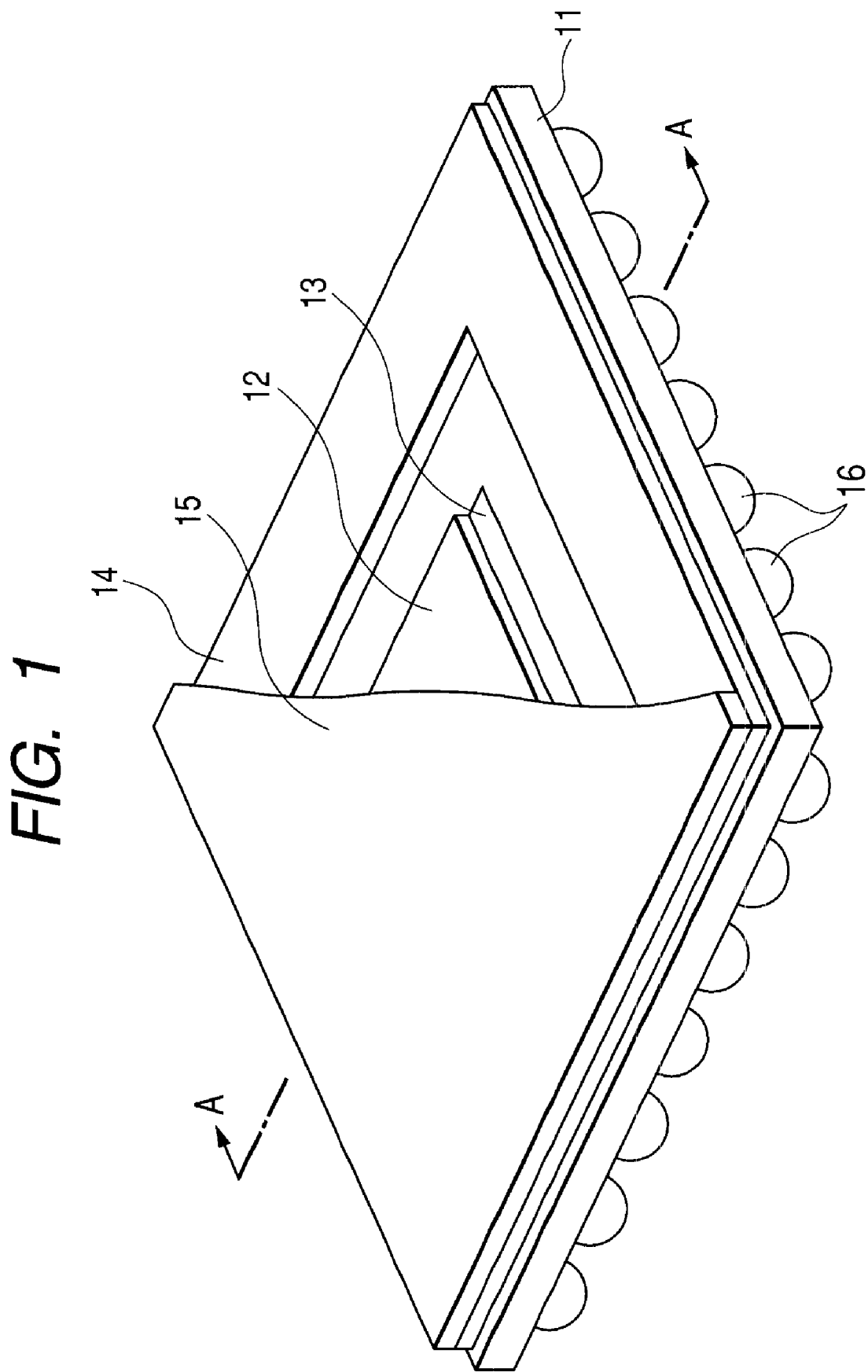
FIG. 1 is a partially cut perspective view showing the semiconductor device concerning Embodiment 1 of the present invention.

FIG. 1 is a partially cut perspective view showing the semiconductor device concerning Embodiment 1 of the present invention. Flip chip connection of the semiconductor chip 12 is made to wiring substrate 11. A gap between wiring substrate 11 and semiconductor chip 12 is filled up with under-filling resin 13. On wiring substrate 11 and around semiconductor chip 12, reinforcement ring 14 is formed, spaced out from semiconductor chip 12. Reinforcement ring 14 is a plate-shaped member with an opening formed in the center thereof. The shape of the opening is defined according to that of semiconductor chip 12.

Heat spreader 15 is adhered to semiconductor chip 12 and reinforcement ring 14. Heat spreader 15 is in a thin plate shape which has much the almost same size as the contour of wiring substrate 11. The heat generated in semiconductor chip 12 is diffused outside through this heat spreader 15.

Solder ball 16 is formed on the back surface of wiring substrate 11. With this solder ball 16, the external electrode of the back surface side of wiring substrate 11 and a mounting substrate (not illustrated) are joined. And the input of a power supply and the input/output of a signal are performed between semiconductor chip 12 and the mounting substrate via wiring substrate 11 and solder ball 16.

Figure 2:
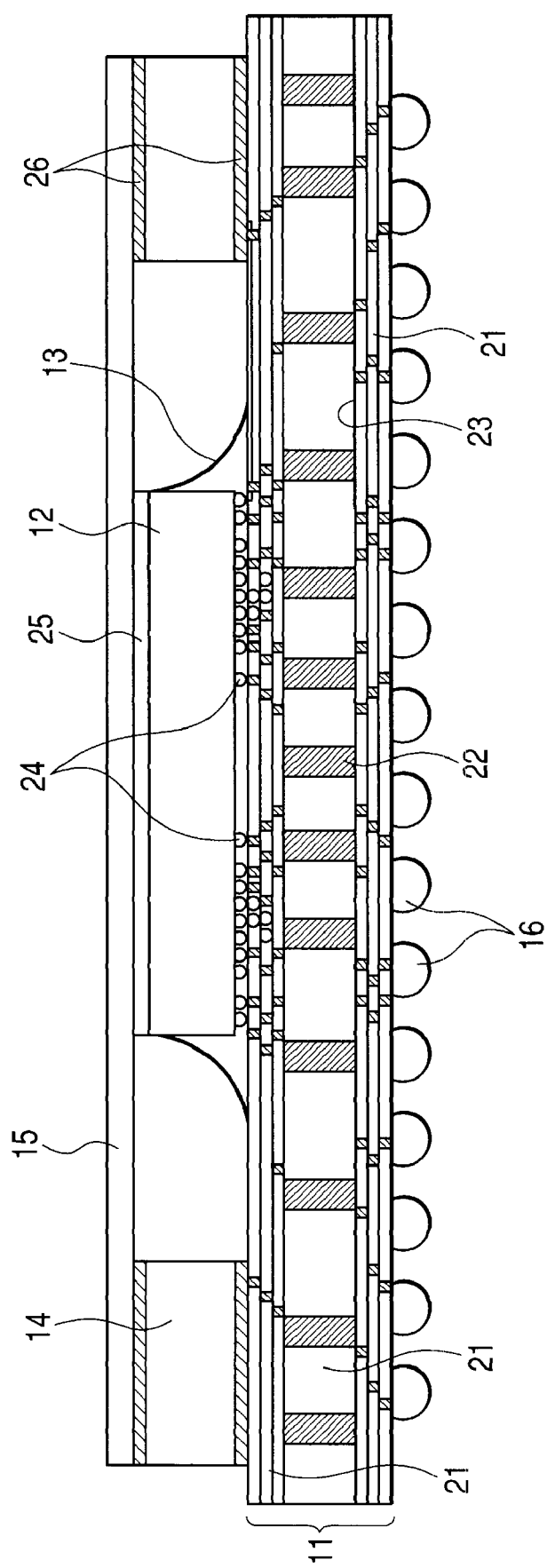
FIG. 2 is a section structure explanatory drawing by the A-A line section in FIG. 1.

FIG. 2 is a section structure explanatory drawing by the A-A line section in FIG. 1. Wiring substrate 11 is the multilayer structure in which a plurality of insulating layers 21 is stacked up. A plurality of wirings 23 and via holes 22 are formed in each insulating layer 21. Since wirings 23 of different insulating layers 21 are mutually connected via via hole 22, the miniaturization of a semiconductor device is realizable. Especially in this embodiment, wiring substrate 11 has the structure which laminates three stacked layers of thin build-up insulating layers to each of both faces of the thick core insulating layer used as the base material of wiring substrate 11. The prepreg which impregnates the epoxy system resin to the glass cloth is used for the core insulating layer, and epoxy system resin with silica filler mixed therein is used for the build-up insulating layer. The build-up layer including a glass cloth can also be used. Via hole 22 for electrically connecting upper and lower wirings 23 is formed in each insulating layer 21. In this embodiment, in a thick core insulating layer, the via hole having a large diameter is formed and the via hole having a small diameter is formed in a thin build-up insulating layer.

A plurality of electrodes (not shown) of semiconductor chip 12 are electrically connected to predetermined wirings of wiring substrate 11 via solder bumps 24, respectively. Adhesive 25 with which semiconductor chip 12 and heat spreader 15 are adhered is a silicone system adhesive with small Young's modulus (E) which softens the stress to semiconductor chip 12. On the other hand, adhesive 26, with which wiring substrate 11 and reinforcement ring 14 are adhered and heat spreader 15 and reinforcement ring 14 are adhered, is an epoxy system adhesive having a excellent thermostability and a merit in cost.

Epoxy system resin and (or) tetrafluoroethylene system resin are used for the material of wiring substrate 11. Here, epoxy system resin means a epoxy system resin in which glass fiber or an acrylic resin is mixed. Tetrafluoroethylene system resin means a tetrafluoroethylene resin in which the acrylic resin etc. is mixed.

Figure 3:
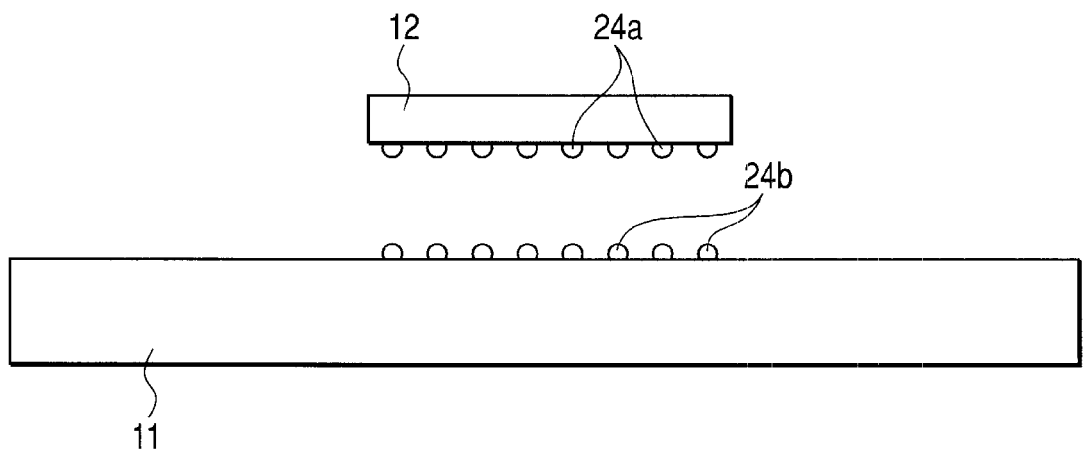
FIGS. 3 to 9 are cross-sectional views for explaining the manufacturing method of the semiconductor device concerning Embodiment 1 of the present invention.

The manufacturing method of the semiconductor device concerning Embodiment 1 of the present invention is explained. First, as shown in FIG. 3, chip side solder bump 24a is formed on the electrode of semiconductor chip 12, and substrate side solder bump 24b is formed on the wiring of wiring substrate 11.

Figure 4:
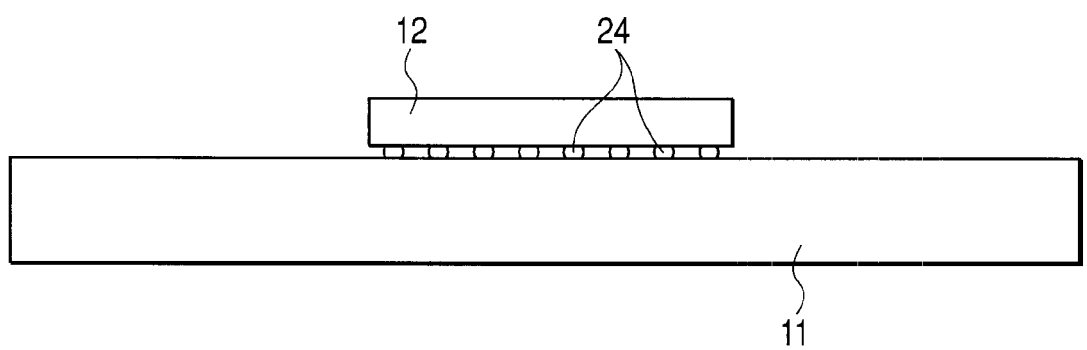

Next, as shown in FIG. 4, semiconductor chip 12 is laid on wiring substrate 11, and is heated with a scrub applied thereto, keeping chip side solder bump 24a in touch to substrate side solder bump 24b. As a result, chip side solder bump 24a and substrate side solder bump 24b melt, and both are united as solder bump 24. The electrode included in semiconductor chip 12 and a plurality of wirings of wiring substrate 11 are electrically connected by solder bump 24. Pb free solder with very low Pb content such as 0.1 wt % or less is used, for example, as material of solder bump 24. The solder of Sn-1 wt % Ag-0.5 wt % Cu composition is used in this embodiment. However, the composition of solder bump 24 is not restricted to the above-mentioned material. In particular, in Pb free solder, since the elastic modulus of solder tends to be high, the internal stress generated in a wiring substrate tends to be large. Therefore, the below-mentioned measures against disconnection of a wiring substrate become important.

Figure 5:
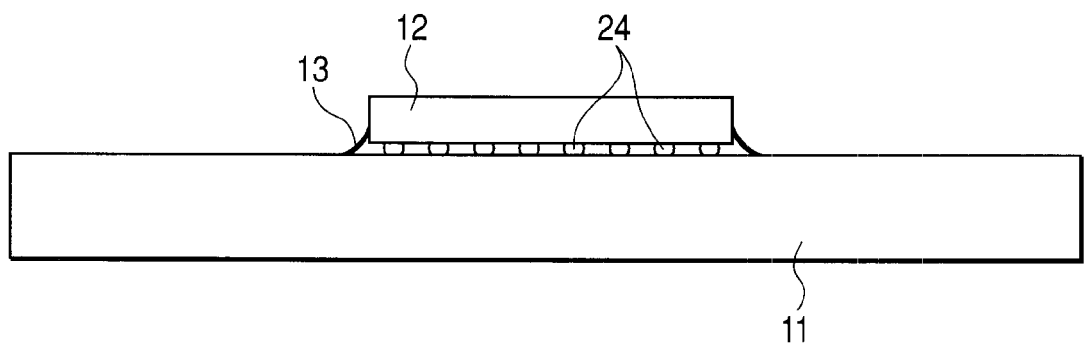
Figure 6:
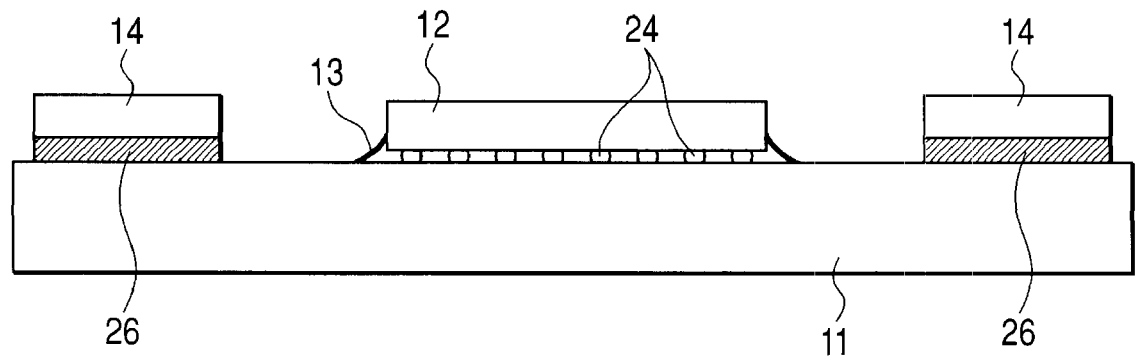

Next, as shown in FIG. 5, a gap between wiring substrate 11 and semiconductor chip 12 is filled up with and hardened with under-fill resin 13, and semiconductor chip 12 is fixed while being stuck to wiring substrate 11. And as shown in FIG. 6, reinforcement ring 14 is adhered to wiring substrate 11 with adhesive 26.

Figure 7:
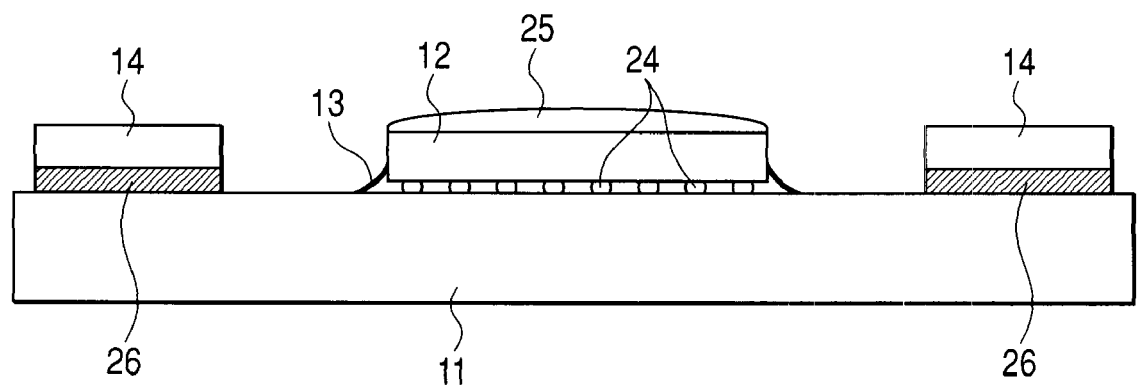
Figure 8:
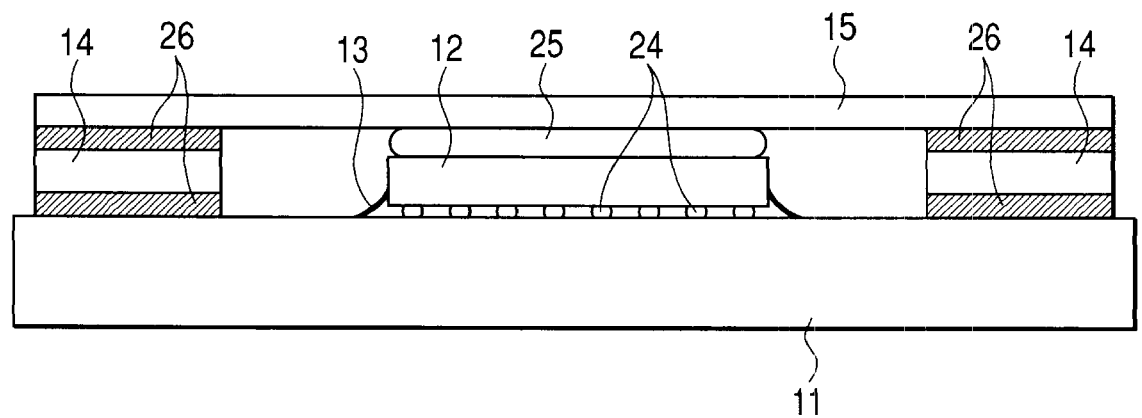

Next, as shown in FIG. 7, adhesive 25 is applied on semiconductor chip 12. And as shown in FIG. 8, film-like adhesive 26 is stuck on reinforcement ring 14, and heat spreader 15 is pasted up on semiconductor chip 12 and reinforcement ring 14. A reinforcement ring of which adhesive 26 is beforehand stuck on both surfaces may be mounted on wiring substrate 11 for the ring 14.

Figure 9:
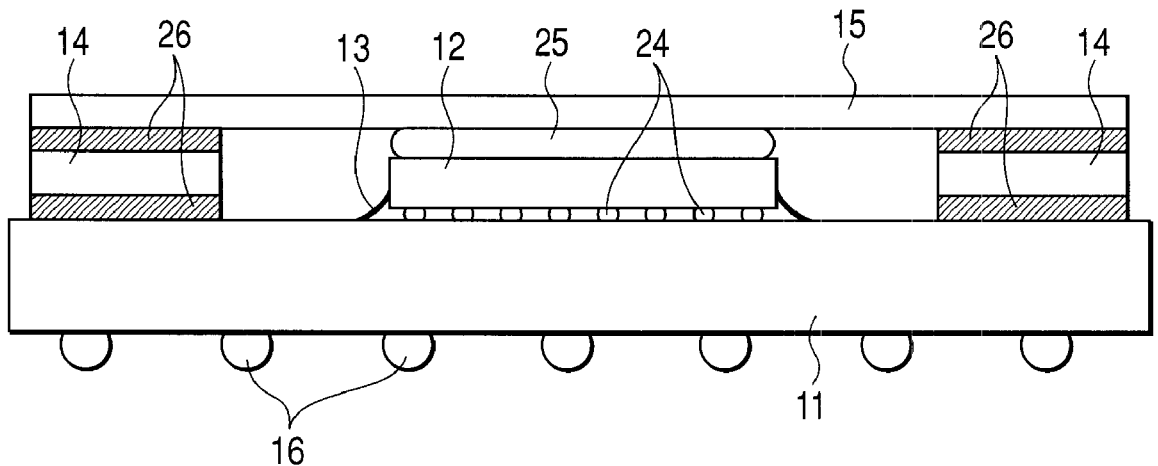

Finally, as shown in FIG. 9, solder ball 16 is formed on the external electrode formed on the back surface of wiring substrate 11. By the above steps, the semiconductor device shown in FIGS. 1 and 2 is manufactured. The composition of solder ball 16 is not restricted to but is composed of Pb free solder. In this embodiment, the composition is Sn-3 wt % Ag-0.5 wt % Cu.

Figure 10:
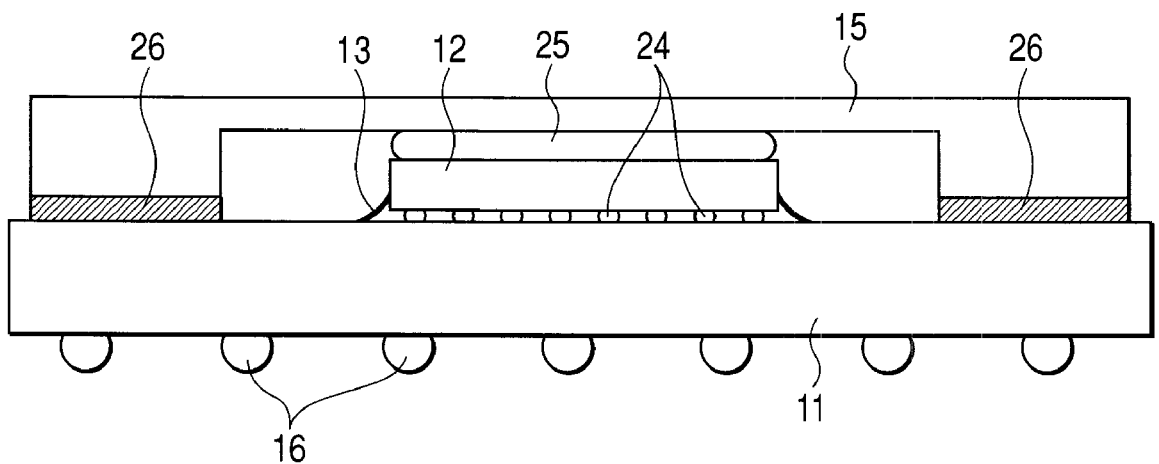
FIG. 10 is a cross-sectional view showing another example of the semiconductor device concerning Embodiment 1 of the present invention.
Figure 11:
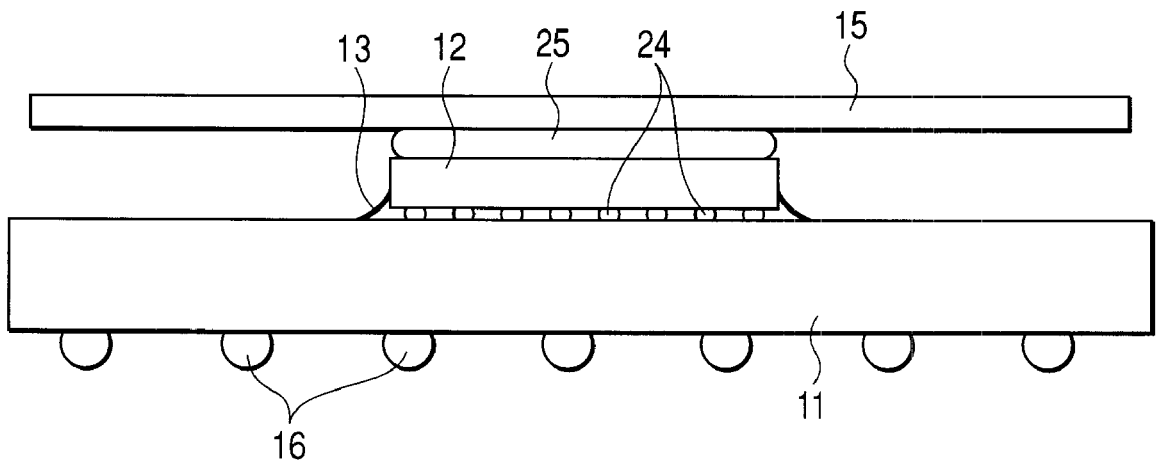
FIG. 11 is a cross-sectional view showing further another example of the semiconductor device concerning Embodiment 1 of the present invention.

As shown in FIG. 10, heat spreader 15 which is molded with reinforcement ring into one member from the metal plate without adhesive 26 may be used. As shown in FIG. 11, it is also possible to have a structure without reinforcement ring 14 and adhesive 26. The internal stress applied to wiring substrate 11 tends to be large in the region between reinforcement, ring 14 and semiconductor chip 12 in the structure which has reinforcement ring 14. That is, when semiconductor chip 12 with a smaller coefficient of thermal expansion compared with wiring substrate 11 is being fixed to wiring substrate 11 by under-filling resin 13, when reinforcement ring 14 is being fixed to wiring substrate 11 around semiconductor chip 12, and when a region where the fixation to a surface of wiring substrate 11 front is weak exists between these semiconductor chip 12 and reinforcement ring 14, that stress tends to concentrate on this portion. Such stress tends to become large along an extension line of a diagonal line of semiconductor chip 12 and in the region of the neighborhood of the extension line. In such a case, the measures against disconnection of a wiring in this region become important especially.

Figure 12:
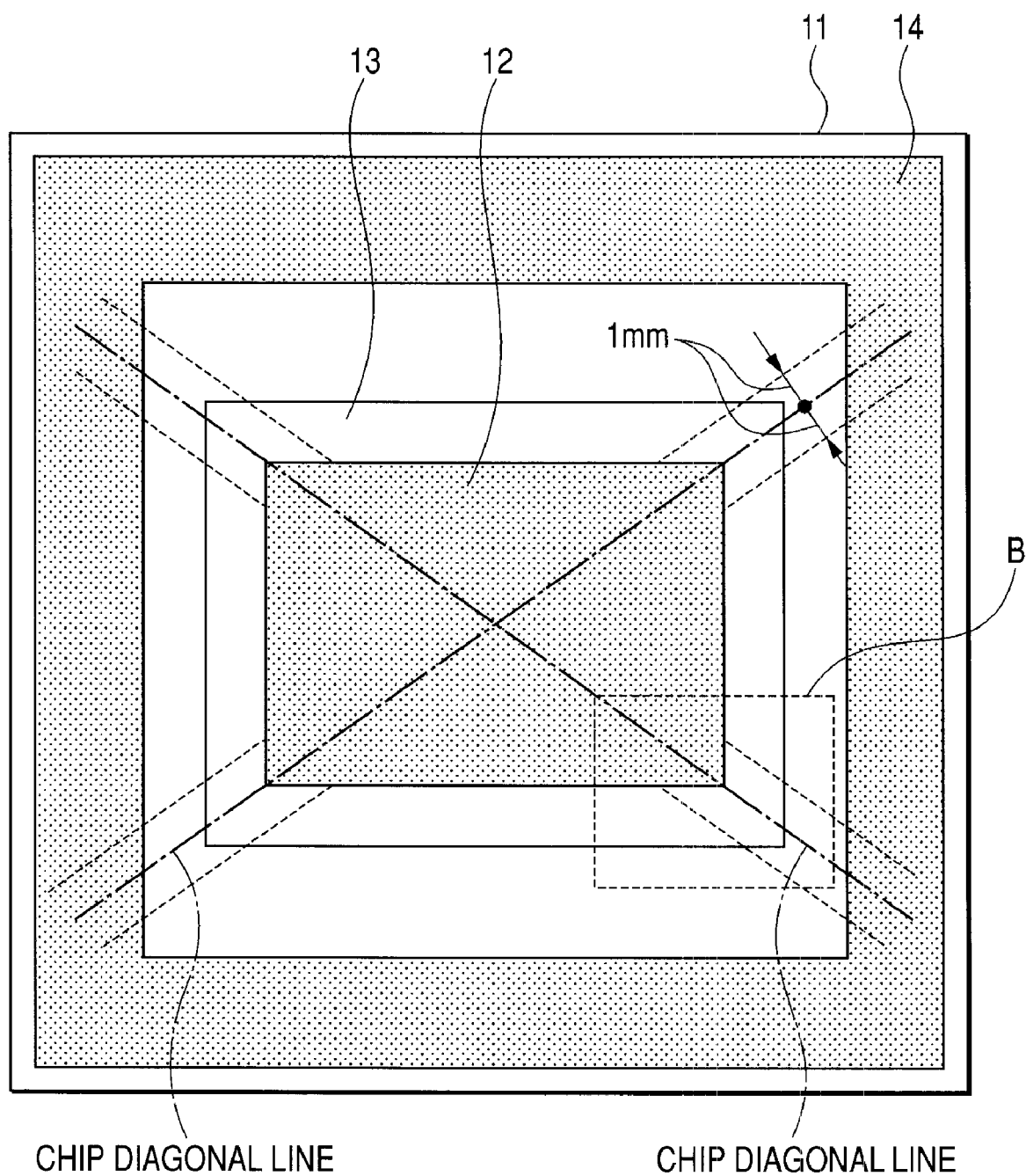
FIG. 12 is a plan view showing the semiconductor device concerning Embodiment 1 of the present invention.
Figure 13:
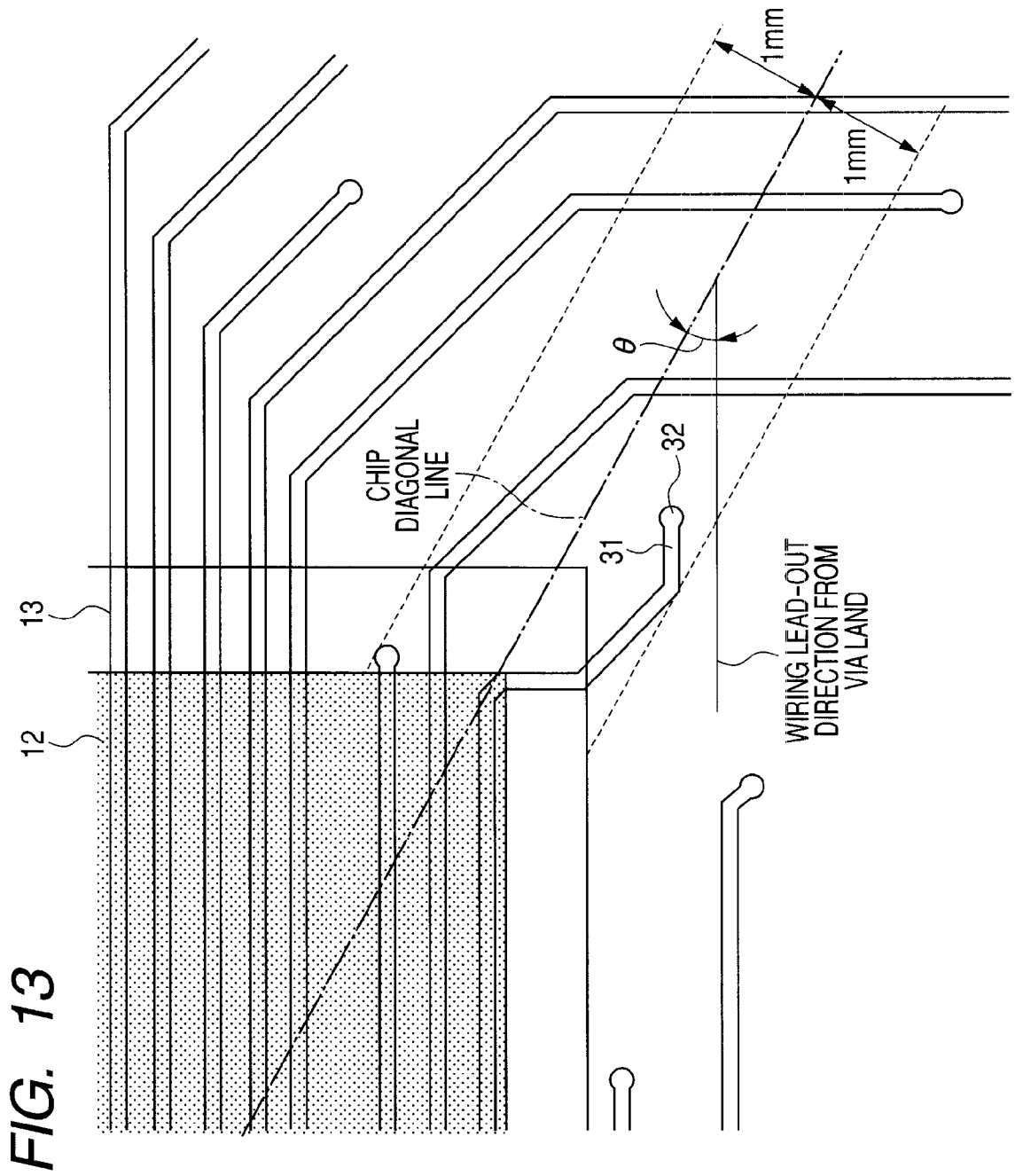
FIG. 13 is a plan view which expands portion B enclosed with the dotted line of FIG. 12.

FIG. 12 is a plan view showing the semiconductor device concerning Embodiment 1 of the present invention, and FIG. 13 is a plan view which expands portion B enclosed with the dotted line of FIG. 12. Wiring 31 and wiring layer via land 32 are formed on wiring substrate 11. Wiring 31 connects wiring layer via land 32 to semiconductor chip 12. Wiring layer via land 32 is located between semiconductor chip 12 and reinforcement ring 14 and formed within a region of 1 mm width from the extension line of the diagonal line of semiconductor chip 12.

Figure 14:
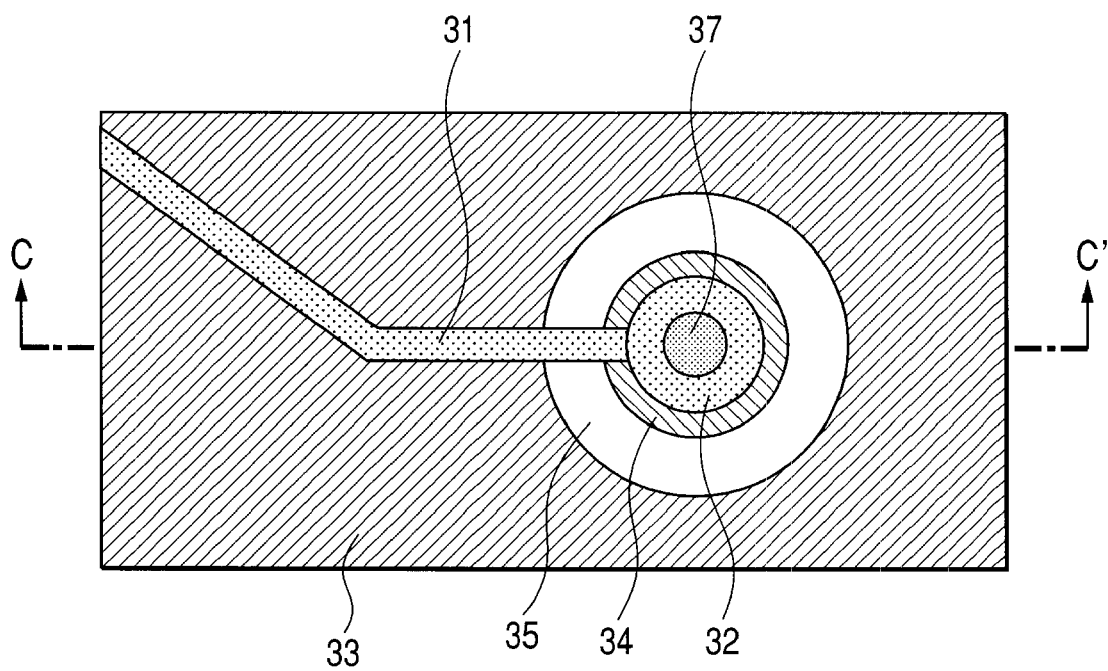
FIG. 14 is an enlarged plan view showing the wiring led out from the wiring layer via land concerning Embodiment 1 of the present invention.
Figure 15:
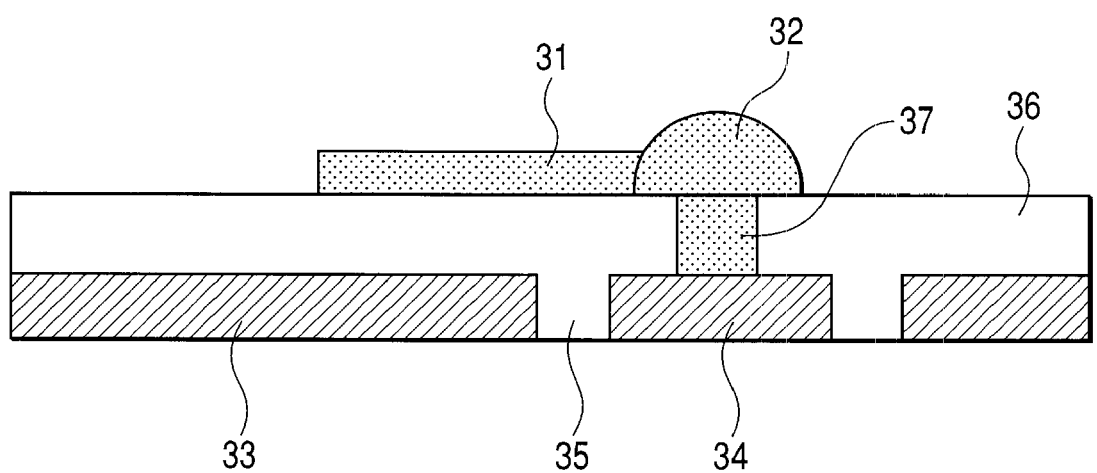
FIG. 15 is a cross-sectional view in C-C' of FIG. 14.

FIG. 14 is an enlarged plan view showing the wiring led out from the wiring layer via land concerning Embodiment 1 of the present invention, and FIG. 15 is a cross-sectional view in C-C' of FIG. 14. Power supply pattern 33 and wiring layer under surface via land 34 are formed on wiring substrate 11, and both are spaced out each other by clearance region 35. Power supply pattern 33 and wiring layer under surface via land 34 are covered with insulating film 36. Wiring layer via land 32 is formed on insulating film 36. Wiring layer under surface via land 34 and wiring layer via land 32 are connected by via 37 which penetrates insulating film 36. Wiring 31 led out from wiring layer via land 32 passes over clearance region 35.

Here, the internal stress by a difference of a coefficient of linear expansion etc. between semiconductor chip 12 and wiring substrate 11 becomes largest in the direction of the extension line of the diagonal line of semiconductor chip 12. So, in Embodiment 1, angle θ of the lead-out direction of wiring 31 from wiring layer via land 32 to the extension line of the diagonal line of semiconductor chip 12 is set to 20° or more, preferably, 30° or more. Since the internal stress applied to wiring 31 near the wiring layer via land 32, especially in a wiring potion over clearance region 35 can be reduced by this, disconnection of wiring 31 led out from wiring layer via land 32 can be prevented.

Embodiment 2

Figure 16:
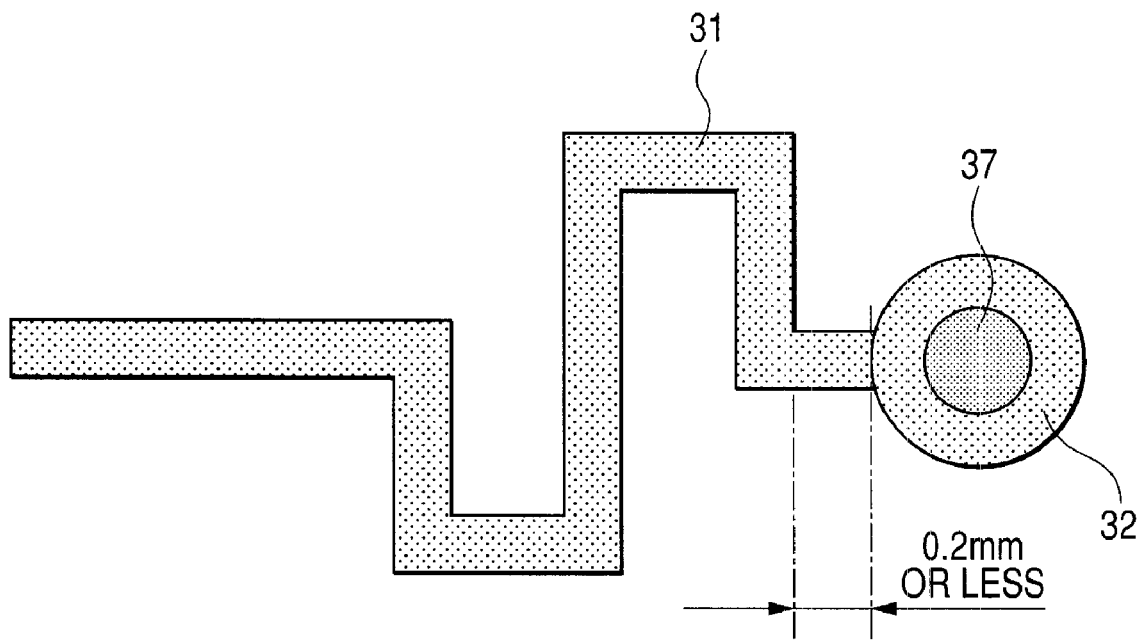
FIG. 16 is an enlarged plan view showing an example of a wiring layer via land and a wiring concerning Embodiment 2 of the present invention.
Figure 17:
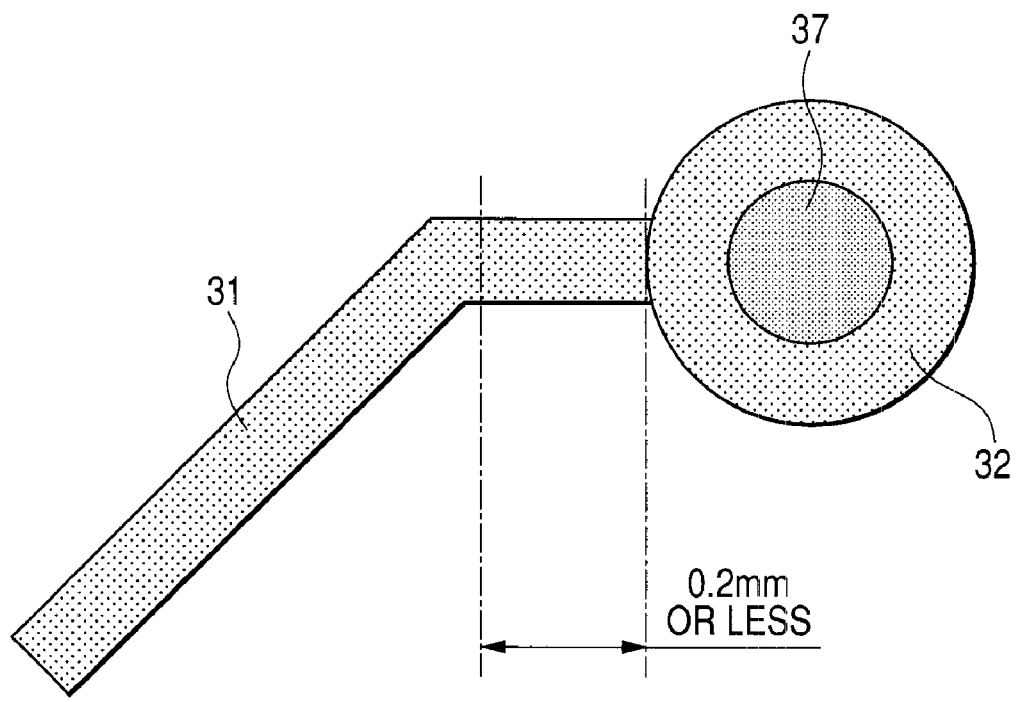
FIG. 17 is an enlarged plan view showing another example of a wiring layer via land and a wiring concerning Embodiment 2 of the present invention.

FIG. 16 is an enlarged plan view showing an example of a wiring layer via land and a wiring concerning Embodiment 2 of the present invention, and FIG. 17 is an enlarged plan view showing another example. As illustrated, wiring 31 is bent at a location 0.2 mm or less away from the boundary with wiring layer via land 32. Other structures are the same as that of Embodiment 1.

Since the internal stress applied to wiring 31 near the wiring layer via land 32, especially in a wiring portion over clearance region 35 can be reduced by this, disconnection of wiring 31 led out from wiring layer via land 32 can be prevented.

Embodiment 3

Figure 18:
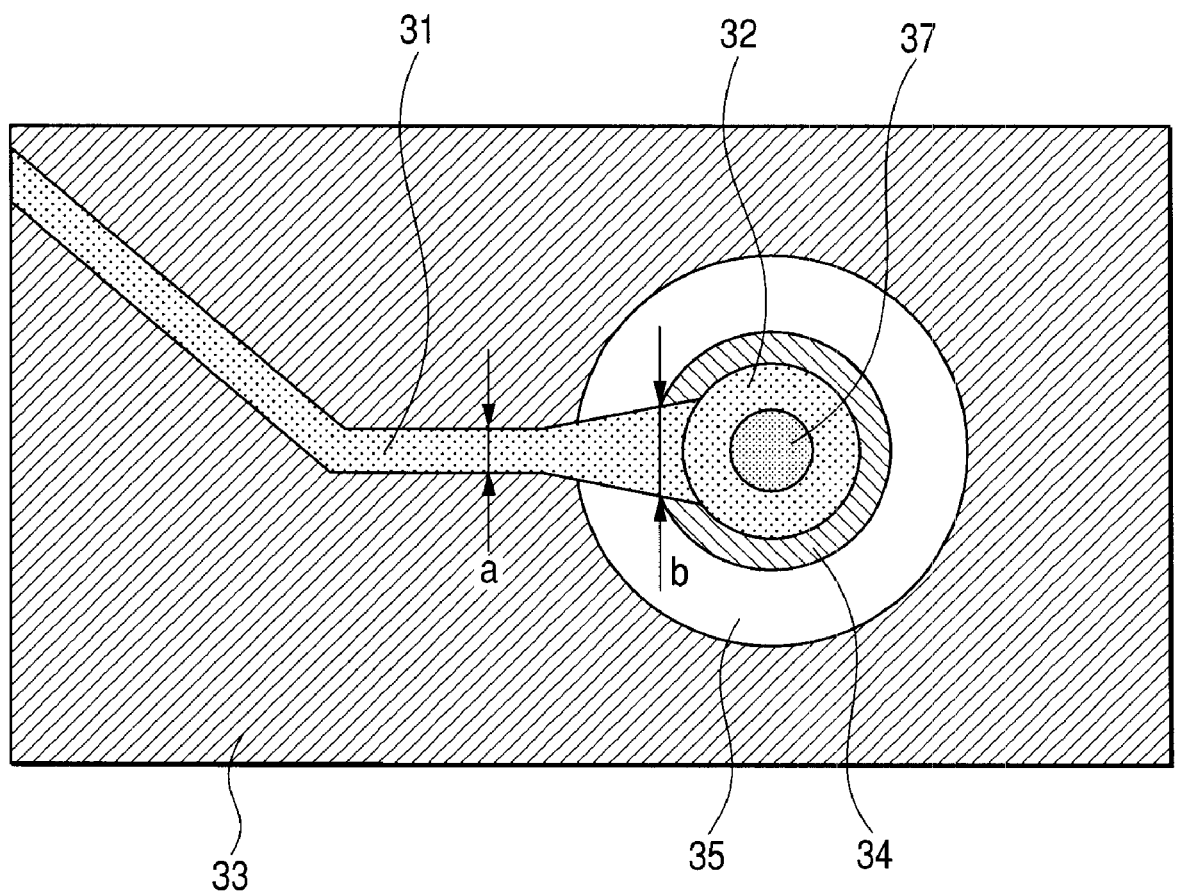
FIG. 18 is an enlarged plan view showing an example of a wiring layer via land and a wiring concerning Embodiment 3 of the present invention.

FIG. 18 is an enlarged plan view showing an example of a wiring layer via land and a wiring concerning Embodiment 3 of the present invention. As illustrated, the width b of wiring 31 over clearance region 35 is larger than the width a of the portion in which wiring 31 becomes thinnest. Other structures are the same as that of Embodiment 1.

Hereby, since the strength of wiring 31 can be improved in a portion over clearance region 35 where internal stress becomes largest, disconnection of wiring 31 led out from wiring layer via land 32 can be prevented.

Embodiment 4

A manufacturing method of a semiconductor device concerning Embodiment 4 has the feature in the step of making flip chip connection of the semiconductor chip to a wiring substrate, and other steps are the same as that of Embodiment 1. Hereafter, the flip chip connection in Embodiment 4 is explained.

Figure 19:
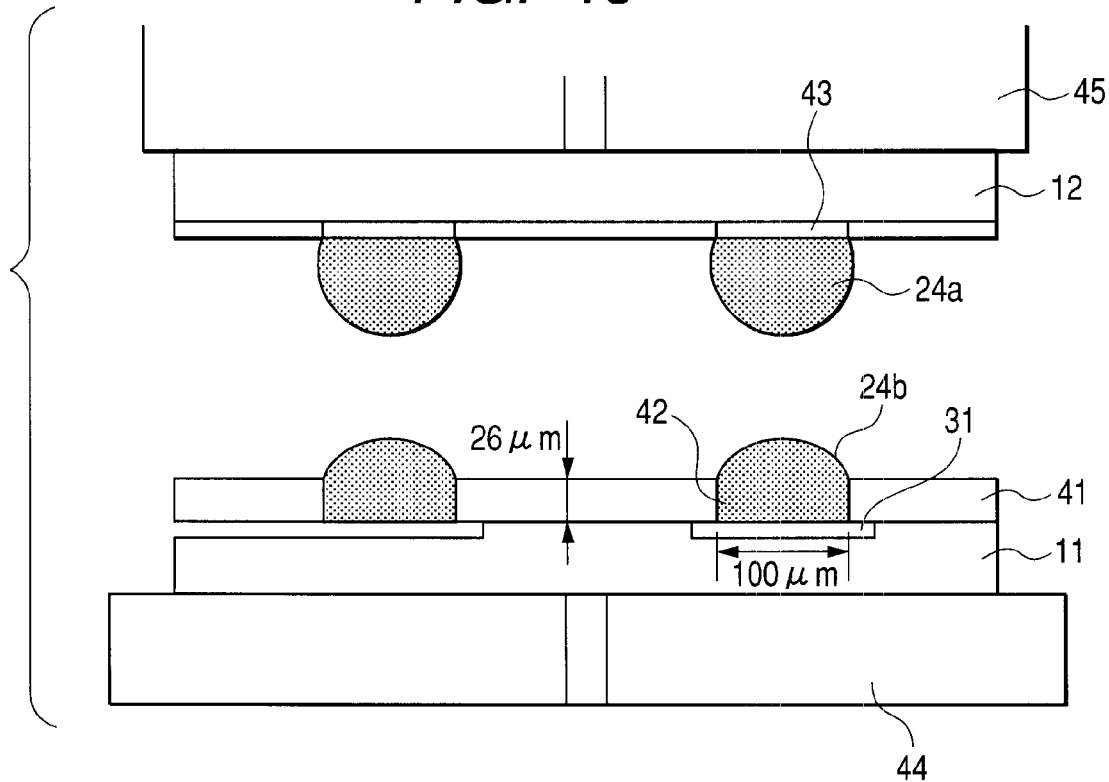
FIGS. 19 to 22 are cross-sectional views for explaining the manufacturing method of the semiconductor device concerning Embodiment 4 of the present invention.

First, as shown in FIG. 19, wiring 31 is formed on wiring substrate 11, upper part of wiring substrate 11 is covered by solder resist 41, and opening 42 is formed in solder resist 41 so that wiring 31 may be exposed. Here, the thickness of solder resist 41 is 26 μm, and the width of opening 42 is 100 μm. Substrate side solder bump 24b is formed on wiring 31 of wiring substrate 11, and chip side solder bump 24a is formed on electrode 43 of semiconductor chip 12. Wiring substrate 11 is laid on stage 44, and vacuum adsorption of the semiconductor chip 12 is performed by bonding head 45. On this occasion, stage 44 and bonding head 45 are heated to predetermined preheat temperature (about 150° C.) lower than a solder melting point.

Figure 20:
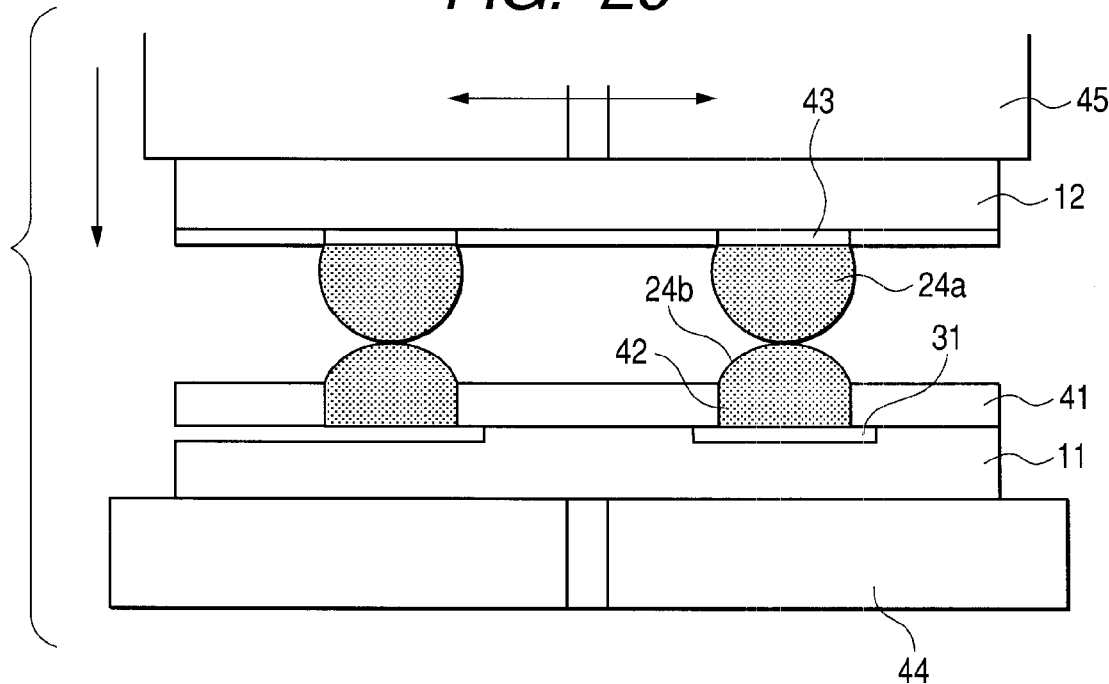

Next, as shown in FIG. 20, bonding head 45 is moved horizontally and semiconductor chip 12 is located above wiring substrate 11. And bonding head 45 is descended and substrate side solder bump 24b and chip side solder bump 24a are contacted.

Figure 21:
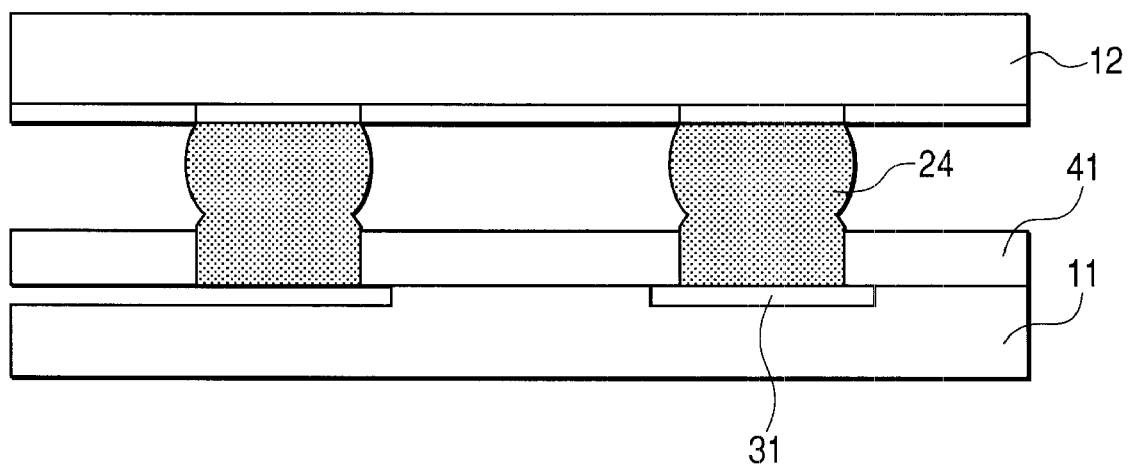

Keeping chip side solder bump 24a in touch to substrate side solder bump 24b, semiconductor chip 12 is heated beyond a solder melting point (about 260° C.) and pressed to wiring substrate 11 with a scrub applied periodically in a horizontal direction or the perpendicular direction. Hereby, flip chip junction of semiconductor chip 12 to wiring substrate 11 can be achieved by fluxless. As a result, as shown in FIG. 21, substrate side solder bump 24b and chip side solder bump 24a are joined, and become solder bump 24. Then, adsorption of semiconductor chip 12 by bonding head 45 is released, bonding head 45 is raised, and bonding is terminated.

Figure 22:
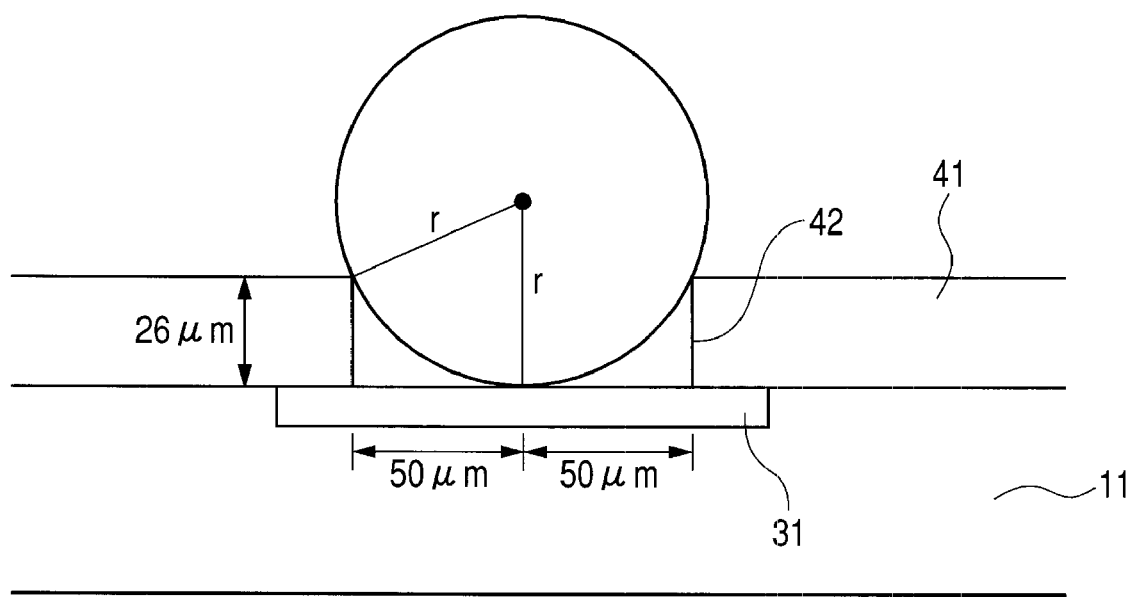
Figure 23:
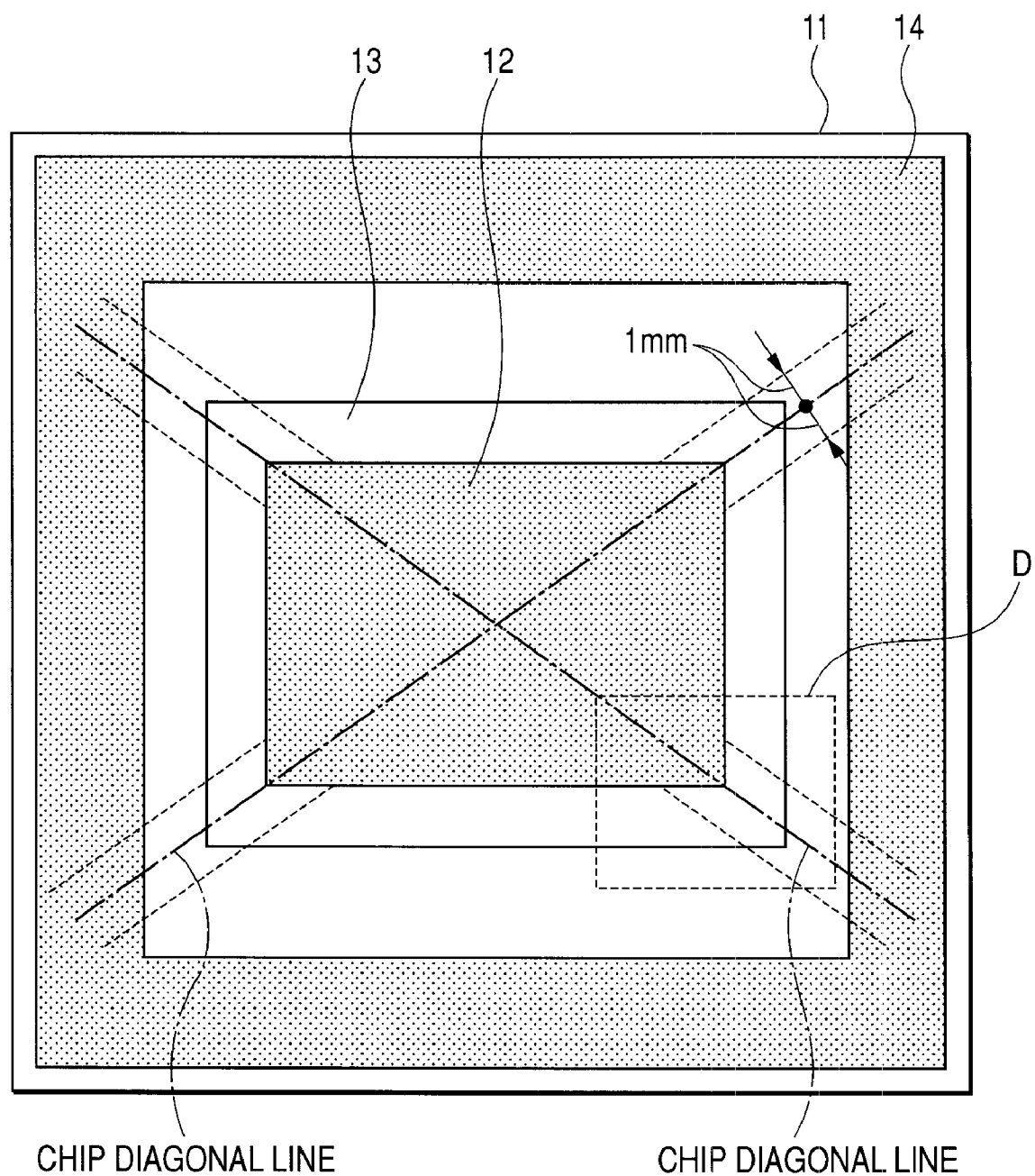
FIG. 23 is a plan view showing a conventional semiconductor device.
Figure 24:
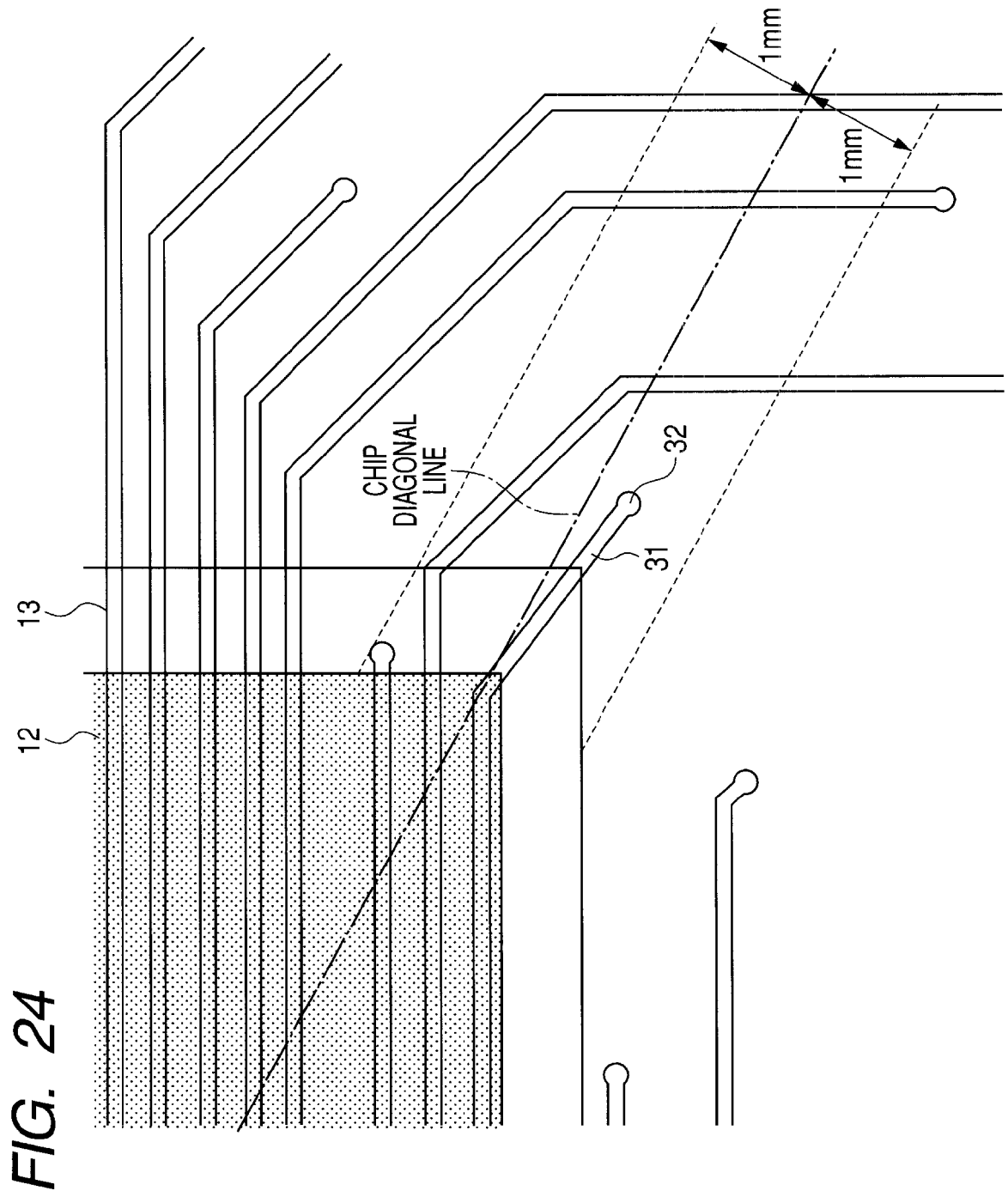
FIG. 24 is a plan view which expands portion D enclosed with the dotted line of FIG. 23.
Figure 25:
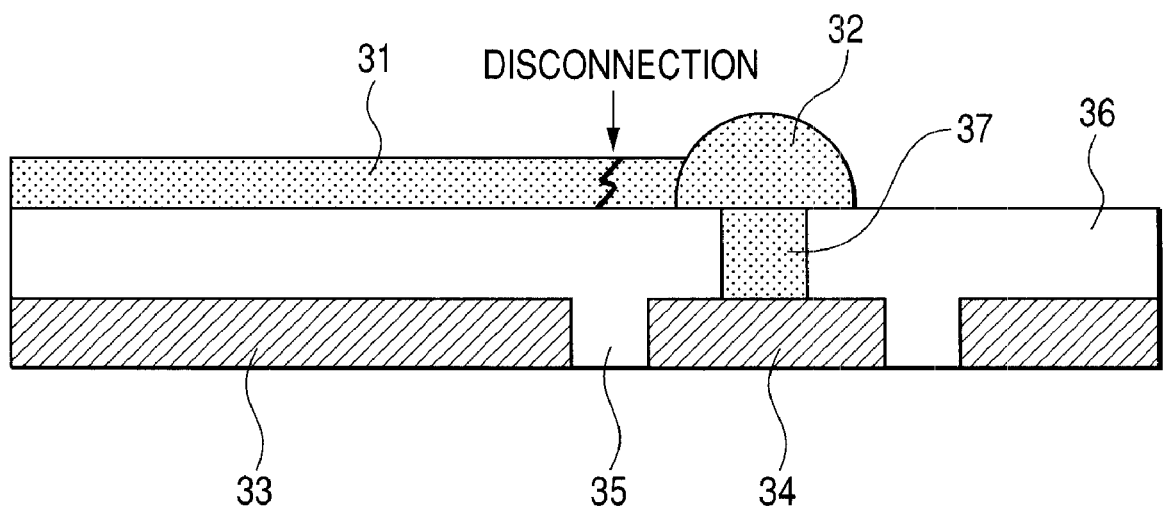
FIG. 25 is a cross-sectional view showing a conventional wiring layer via land and a conventional wiring.
Figure 26:
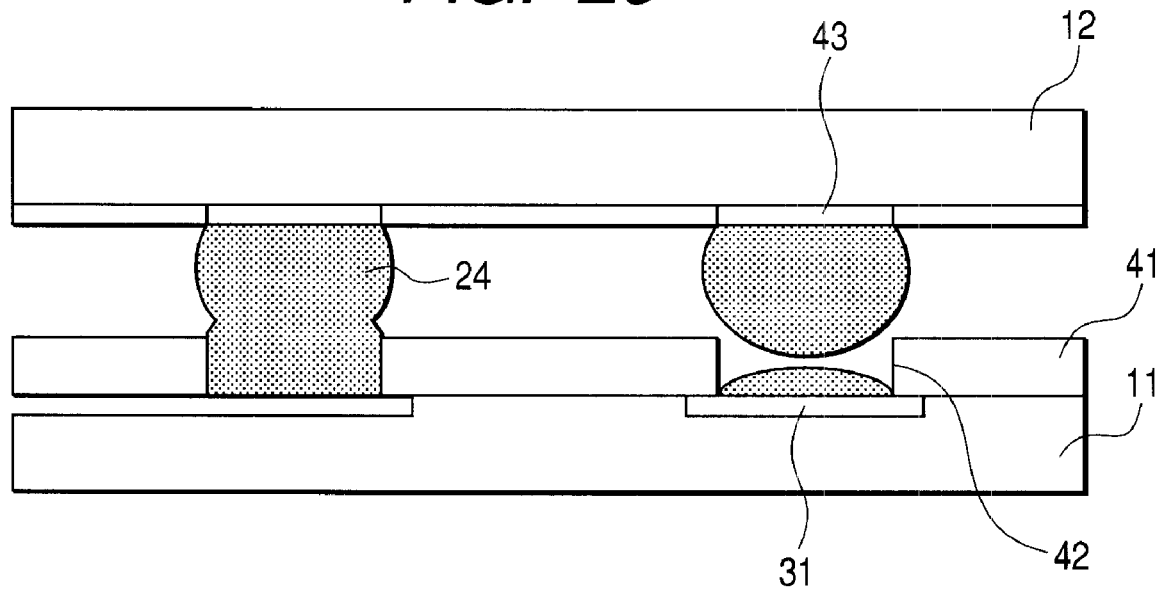
FIG. 26 is a cross-sectional view showing the manner where flip chip connection of the semiconductor chip was made to the wiring substrate by the conventional method.

Thickness of solder resist 41 is made less than or equal to 26 μm in Embodiment 4. The solder amount of solder bump 24 is made smaller than the volume of the ball inscribed on a corner of opening 42 of solder resist 41 and on electrode 43 as shown in FIG. 22 by this. Hereby, the stress which the solder bump having a tendency to become spherical with surface tension, receives from the corner of the opening of solder resist can be made small. Therefore, an open failure of a solder bump can be prevented. Since the open failure of solder bump is likely to occur especially when a scrub is applied to a semiconductor chip in the step of making flip chip connection, the present invention is effective.

What is claimed is:

1. A semiconductor device, comprising:
a wiring substrate;
a semiconductor chip making flip chip connection to the wiring substrate;
under-filling resin with which a gap between the wiring substrate and the semiconductor chip is filled up;
a heat spreader adhered to the semiconductor chip;
a power supply pattern and a wiring layer under surface via land which are formed on the wiring substrate and spaced out each other by a clearance region;
an insulating film which covers the power supply pattern and the wiring layer under surface via land;
a wiring layer via land formed on the insulating film;
a via which penetrates the insulating film and connects the wiring layer under surface via land to the wiring layer via land; and
a wiring which is formed on the insulating film, passes over the clearance region, and connects the wiring layer via land to the semiconductor chip;
wherein
the wiring layer via land is formed outside the semiconductor chip, and within a region of 1 mm width from an extension line of a diagonal line of the semiconductor chip; and
an angle of a lead-out direction of the wiring from the wiring layer via land to an extension line of a diagonal line of the semiconductor chip is 20° or more.

2. A semiconductor device according to claim 1, wherein the angle of the lead-out direction of the wiring from the wiring layer via land to the extension line of the diagonal line of the semiconductor chip is 30° or more.

3. A semiconductor device according to claim 1, further comprising
a reinforcement ring adhered to the wiring substrate around the semiconductor chip, the wiring layer via land being formed in a region between the semiconductor chip and the reinforcement ring.

4. A semiconductor device, comprising:
a wiring substrate;
a semiconductor chip making flip chip connection to the wiring substrate;
under-filling resin with which a gap between the wiring substrate and the semiconductor chip is filled up;
a heat spreader adhered to the semiconductor chip;
a power supply pattern and a wiring layer under surface via land which are formed on the wiring substrate and spaced out each other by a clearance region;
an insulating film which covers the power supply pattern and the wiring layer under surface via land;
a wiring layer via land formed on the insulating film;
a via which penetrates the insulating film and connects the wiring layer under surface via land to the wiring layer via land; and
a wiring which is formed on the insulating film, passes over the clearance region, and connects the wiring layer via land to the semiconductor chip;
wherein
the wiring layer via land is formed outside the semiconductor chip, and within a region of 1 mm width from an extension line of a diagonal line of the semiconductor chip; and
the wiring is bent at a location 0.2 mm or less away from a boundary with the wiring layer via land.

5. A semiconductor device according to claim 4, further comprising
a reinforcement ring adhered to the wiring substrate around the semiconductor chip, the wiring layer via land being formed in a region between the semiconductor chip and the reinforcement ring.

6. A semiconductor device, comprising:
a wiring substrate;
a semiconductor chip making flip chip connection to the wiring substrate;
under-filling resin with which a gap between the wiring substrate and the semiconductor chip is filled up;
a heat spreader adhered to the semiconductor chip;
a power supply pattern and a wiring layer under surface via land which are formed on the wiring substrate and spaced out each other by a clearance region;
an insulating film which covers the power supply pattern and the wiring layer under surface via land;
a wiring layer via land formed on the insulating film;
a via which penetrates the insulating film and connects the wiring layer under surface via land to the wiring layer via land; and
a wiring which is formed on the insulating film, passes over the clearance region, and connects the wiring layer via land to the semiconductor chip;
wherein
the wiring layer via land is formed outside the semiconductor chip, and within a region of 1 mm width from an extension line of a diagonal line of the semiconductor chip; and
a width of the wiring over the clearance region is larger than a width of the thinnest portion in the wiring.

7. A semiconductor device according to claim 6, further comprising
a reinforcement ring adhered to the wiring substrate around the semiconductor chip, the wiring layer via land being formed in a region between the semiconductor chip and the reinforcement ring.

* * * * *